US008608858B2

(12) United States Patent
Hamada

(10) Patent No.: US 8,608,858 B2
(45) Date of Patent: Dec. 17, 2013

(54) SUBSTRATE CLEANING APPARATUS AND METHOD FOR DETERMINING TIMING OF REPLACEMENT OF CLEANING MEMBER

(75) Inventor: Satomi Hamada, Fujisawa (JP)

(73) Assignee: Ebara Corporation, Tokyo (JP)

(*) Notice: Subject to any disclaimer, the term of this patent is extended or adjusted under 35 U.S.C. 154(b) by 1057 days.

(21) Appl. No.: 11/631,244

(22) PCT Filed: Sep. 13, 2005

(86) PCT No.: PCT/JP2005/017226
§ 371 (c)(1),
(2), (4) Date: Jan. 4, 2007

(87) PCT Pub. No.: WO2006/035624
PCT Pub. Date: Apr. 6, 2006

(65) Prior Publication Data
US 2008/0289652 A1   Nov. 27, 2008

(30) Foreign Application Priority Data
Sep. 28, 2004   (JP) ................................. 2004-282037

(51) Int. Cl.
*B08B 7/00* (2006.01)
(52) U.S. Cl.
USPC .............................................. 134/6; 134/1.3
(58) Field of Classification Search
None
See application file for complete search history.

(56) References Cited

U.S. PATENT DOCUMENTS

| 5,636,401 A | 6/1997 | Yonemizu et al. |
| 5,882,426 A | 3/1999 | Yonemizu et al. |
| 6,409,576 B1 | 6/2002 | Oguri et al. |
| 2002/0009316 A1* | 1/2002 | Endo et al. ..................... 399/349 |
| 2002/0029431 A1 | 3/2002 | Oikawa et al. |
| 2002/0102116 A1* | 8/2002 | Katayanagi et al. ........... 399/333 |
| 2002/0139393 A1 | 10/2002 | Crevasse et al. |
| 2002/0173259 A1* | 11/2002 | Drury ........................... 451/526 |

FOREIGN PATENT DOCUMENTS

| JP | 05-317783 | 12/1993 |
| JP | 5-326474 | 12/1993 |
| JP | 07-307321 | 11/1995 |

(Continued)

OTHER PUBLICATIONS

JPO machine translation of JP 2004105848, retrieved Oct. 22, 2010.*

(Continued)

*Primary Examiner* — Eric Golightly
(74) *Attorney, Agent, or Firm* — Wenderoth, Lind & Ponack, L.L.P.

(57) ABSTRACT

A substrate cleaning apparatus includes a cleaning apparatus 10 including an abutting member which is to be pressed against a cleaning member to clean the cleaning member, a drive control device for controllably driving the abutting member, and a cleaning tank which contains a cleaning liquid and allows a portion of abutment between the cleaning member and the abutting member to be impregnated with the cleaning liquid. The substrate cleaning apparatus also includes an image capturing device which captures a surface image of the cleaning member and an image processing device. A surface condition of the cleaning member is monitored to determine the timing of replacement of the cleaning member. The substrate cleaning apparatus further includes a measurement device which measures the number of particles and/or a concentration of a component in the cleaning liquid in the cleaning tank. Results of measurement by the measurement device are fed back to a drive control device, to thereby prevent contamination of the cleaning member.

13 Claims, 10 Drawing Sheets

(56) References Cited

FOREIGN PATENT DOCUMENTS

| JP | 9-92633 | 4/1997 |
| JP | 10-109074 | 4/1998 |
| JP | 10-163143 | 6/1998 |
| JP | 2002-359222 | 12/2002 |
| JP | 2003-243350 | 8/2003 |
| JP | 2004-105848 | 4/2004 |

OTHER PUBLICATIONS

English translation of JP 2004-105848 dated Apr. 8, 2004 (to replace JPO Machine Translation currently of record).

* cited by examiner

SUBSTRATE CLEANING APPARATUS AND METHOD FOR DETERMINING TIMING OF REPLACEMENT OF CLEANING MEMBER

BACKGROUND OF THE INVENTION

1. Technical Field

The present invention relates to a substrate cleaning apparatus comprising a cleaning member, in which the cleaning member is abutted against a substrate that requires a high degree of cleanliness, such as a semiconductor substrate, a glass substrate, a liquid crystal panel, etc., to thereby effect scrub cleaning of the substrate. More specifically, the present invention relates to a method for determining the timing of the replacement of a cleaning member used for a substrate cleaning apparatus, in which the timing of the replacement of a cleaning member is determined, based on a surface condition of the cleaning member, to thereby maintain a clean condition of a cleaning member. The present invention also relates to a substrate cleaning apparatus.

2. Technical Background

As a conventional method for cleaning a surface of a substrate, such as a semiconductor substrate, scrub cleaning is conducted by rubbing a cleaning member, such as a brush or a sponge, against a surface of the substrate, while feeding pure water onto the substrate surface. Scrub cleaning is highly effective in removing contaminants deposited on the substrate. However, there is a disadvantage that, since the cleaning member is in direct contact with the substrate during cleaning, the cleaning member itself is contaminated as a result of use over a long period of time, and its ability to clean the substrate becomes low. Further, as an amount of contamination of the cleaning member increases, not only the substrate cleaning ability of the cleaning member becomes low, but also further contamination of a substrate occurs due to contaminants deposited on the cleaning member, and thus the effect of cleaning cannot be obtained.

To obviate these disadvantages, various methods have been proposed, such as a method of applying ultrasonic vibrations to the cleaning member while feeding a cleaning liquid to the cleaning member (JP-A-5-317783), a method of cleaning a substrate with a cleaning brush in a cleaning liquid to which ultrasonic vibrations are applied (JP-A-6-5577), and a method of rubbing a cleaning member and an abutting member against each other in a cleaning liquid to which ultrasonic waves are applied (JP-A-10-109074). These methods are effective in removing contaminants in a relatively superficial layer of the cleaning member. These methods are unsatisfactory, however, from the viewpoint of removing contaminants which have penetrated into an interior of the cleaning member. As a countermeasure, it has been proposed to suppress contamination of the interior of the cleaning member by supplying a cleaning liquid from a cleaning liquid supply portion provided in the interior of the cleaning member. In this method, however, it is difficult to clean the interior of the cleaning member at a position remote from the cleaning liquid supply portion.

Deterioration of a material of the cleaning member is also a factor of contamination of a substrate caused by the cleaning member. Due to an operation of abutting and rubbing the cleaning member against a substrate, an amount of wear of a surface of the cleaning member gradually increases. A resin such as polyvinyl alcohol (PVA) is widely used as a material for a cleaning member. It is molded in a porous form, and comprises an exterior layer formed in the vicinity of a surface in contact with a mold during molding, and an interior layer formed inside the exterior layer. The exterior layer formed in the vicinity of an exterior surface of the cleaning member (a thin superficial layer) consists of a hard layer having a thickness of about several µm to about 10 µm, and contains a small number of pores having a diameter as small as several to several tens of µm. The hard exterior layer gradually wears during cleaning, due to a repeated operation of rubbing the surface of the cleaning member against the substrate. Finally, the interior layer formed inside the exterior layer, which comprises a soft resin material, is exposed and brought into contact with the substrate to be cleaned. The pores formed in the soft interior layer have a diameter as large as 10 µm to 200 µm. Since the interior layer is liable to wear as compared to the exterior layer, a number of scraps are generated due to wear when the interior layer is rubbed against the substrate, and cause a so-called particle contamination of the substrate.

By repeatedly rubbing the cleaning member against the substrate, not only a surface of the cleaning member wears, but also contaminants gradually penetrate into the interior of the cleaning member and are accumulated in the cleaning member. When such a cleaning member is used, a rate of removal of contaminants from the substrate lowers, and further contamination of the substrate caused by the cleaning member occurs. To obviate these disadvantages, a cleaning member should be sequentially replaced with a new cleaning member in a clean condition. Therefore, in a conventional technique, the timing of replacement of a cleaning member is determined by predicting, from results of experiments, an appropriate number of substrates to be treated. In fact, however, the effective number of substrates to be treated varies, depending on the condition of the substrate and the conditions of cleaning. There is also a method for determining the timing of replacement of a cleaning member by performing sampling inspection of a substrate, or cleaning and evaluating a substrate prepared for evaluation of contamination during the time between substrate-cleaning operations. In this case, if inspection of a substrate is conducted at short-time intervals, replacement can be conducted at an early stage of contamination of the cleaning member, and a high degree of cleanliness of a substrate can be maintained. However, this method is costly and time-consuming.

If the inspection is conducted at distant intervals, for example, if a substrate for evaluation is supplied at distant intervals, a number of substrates may already be treated by using a contaminated or worn cleaning member at the time of detection of contamination or wear of the cleaning member. This leads to a situation such that substrates after the cleaning operation are contaminated. There is a method for determining contamination of a cleaning member by monitoring a contaminated condition of a waste liquid discharged during a substrate-cleaning operation. In this case, however, contaminants removed from the substrate itself are also contained in the waste liquid, and it is difficult to determine whether a source of contaminants is a substrate or a cleaning member.

SUMMARY OF THE INVENTION

In view of the above, the present invention has been made. It is an object of the present invention to provide a method for determining the timing of replacement of a cleaning member for a substrate cleaning apparatus, and a substrate cleaning apparatus, in which a worn or contaminated condition of a cleaning member is monitored, to thereby determine the timing of replacement and thus always maintain an unworn, clean condition of a cleaning member.

In order to achieve the above-mentioned object, the present invention provides a method for determining timing of replacement of a cleaning member provided in a substrate cleaning apparatus in which the cleaning member is abutted against a substrate to effect scrub cleaning of the substrate. In the method of the present invention, replacement of a cleaning member is conducted at the time an exterior layer of the cleaning member has been lost, which time is detected by different techniques, according to characteristics of the cleaning member.

In the method of the present invention, a surface condition of the cleaning member during a substrate cleaning operation or a cleaning-member cleaning operation is detected by surface condition detecting means adapted to detect a surface condition of the cleaning member. Timing of replacement of the cleaning member is determined, based on a change in the surface condition detected by the surface condition detecting means.

The change in the surface condition of the cleaning member detected to determine the timing of replacement of the cleaning member may include a change in pore condition of a surface of the cleaning member, such as a pore size distribution or a total pore area per unit area of the surface of the cleaning member, or may include a change in hardness of a surface of the cleaning member.

The present invention also provides a method for determining timing of replacement of a cleaning member provided in a substrate cleaning apparatus in which the cleaning member is abutted against a substrate to effect scrub cleaning of the substrate. During scrub cleaning of the substrate in which the cleaning member is abutted against the substrate while rotating at least one of the cleaning member and the substrate to thereby effect relative motion between the cleaning member and the substrate, a condition of rotation of the at least one of the cleaning member and the substrate is measured by a rotation measurement device. A surface condition of the cleaning member is detected from a change in the condition of rotation and the timing of replacement of the cleaning member is determined from a change in the detected surface condition.

The present invention provides a substrate cleaning apparatus comprising a cleaning member. The cleaning member is adapted to be abutted against a substrate to effect scrub cleaning of the substrate. The substrate cleaning apparatus further comprises a surface condition detecting unit adapted to detect a surface condition of the cleaning member during a substrate cleaning operation or a cleaning-member cleaning operation; and a timing-of-replacement determining unit adapted to determine timing of replacement of the cleaning member, based on a change in the surface condition of the cleaning member detected by the surface condition detecting means.

In this substrate cleaning apparatus, the surface condition detecting unit may comprise rotation measurement device adapted to measure a condition of rotation of at least one of the cleaning member and the substrate. During scrub cleaning of the substrate in which the cleaning member is abutted against the substrate while rotating at least one of the cleaning member and the substrate to thereby effect relative motion between the cleaning member and the substrate, the condition of rotation of the at least one of the cleaning member and the substrate may be measured. The timing-of-replacement determining unit may be adapted to detect a surface condition of the cleaning member, based on a change in the measured condition of rotation.

The surface condition detecting unit may comprise an image capturing device adapted to capture an image of a surface of the cleaning member.

The timing-of-replacement determining unit may be adapted to process image data captured by the image capturing device and determine the timing of replacement of the cleaning member, based on a pore condition of the surface of the cleaning member, such as a pore size distribution or a total pore area per unit area of the surface of the cleaning member.

The surface condition detecting unit may comprise an observation medium provided between the cleaning member and the image capturing device, the image capturing means being adapted to capture the image of the surface of the cleaning member through the observation medium.

The observation medium may be a solid member made of a transparent or semi-transparent material, such as glass, a liquid such as a cleaning liquid, or a gas.

The surface condition detecting device may comprise a hardness measurement unit adapted to measure the hardness of a surface of the cleaning member, the timing-of-replacement determining unit being adapted to determine the timing of replacement of the cleaning member based on the hardness of the surface of the cleaning member measured by the hardness measurement unit.

The hardness measurement unit may comprise an ultra-micro hardness meter or a thin-film hardness meter.

The timing-of-replacement determining unit may emit a signal for replacement of the cleaning member when the surface condition detected by the surface condition detecting unit changes from the one that indicates an exterior layer to the one that indicates an interior layer.

The substrate cleaning apparatus may further comprise a cleaning member cleaning apparatus including:
an abutting member which is pressed against the cleaning member to effect cleaning of the cleaning member;
drive control means adapted to controllably drive the abutting member; and
a cleaning tank which contains a cleaning liquid and which allows at least a portion of abutment between the cleaning member and the abutting member to be impregnated with the cleaning liquid in the cleaning tank. The apparatus also comprises a measurement unit adapted to measure at least one of the number of particles in the cleaning liquid and a concentration of a component in the cleaning liquid in the cleaning tank; and
a feedback mechanism for feeding back results of measurement by the measurement means to the drive control means.

The present invention also provides a substrate cleaning apparatus comprising a cleaning member cleaning apparatus including:
a cleaning member adapted to be abutted against a substrate to effect scrub cleaning of the substrate, the cleaning member having an exterior layer made of sponge or cloth;
an abutting member adapted to be pressed against the cleaning member to effect cleaning of the cleaning member; drive control means adapted to controllably drive the abutting member; and
a cleaning tank which contains a cleaning liquid and which allows at least a portion of abutment between the cleaning member and the abutting member to be impregnated with the cleaning liquid in the cleaning tank. The apparatus also comprises a measurement unit adapted to measure at least one of the number of particles in the cleaning liquid and a concentration of a component in the cleaning liquid in the cleaning tank; and a feedback mechanism for feeding back results of measurement by the measurement means to the drive control means.

The substrate cleaning apparatus of the present invention may further comprise an overflow mechanism for overflowing the cleaning liquid contained in the cleaning tank after the cleaning member is cleaned, or a cleaning liquid supply mechanism for supplying the cleaning liquid to the cleaning member when the cleaning member is lifted from the cleaning tank.

A signal for replacement of the cleaning member may be emitted when the at least one of the number of particles in the cleaning liquid and the concentration of the component in the cleaning liquid reaches a predetermined level.

The substrate cleaning apparatus may further comprise an ultrasonic cleaning mechanism for conducting ultrasonic cleaning of at least one of the cleaning member, the abutting member, the cleaning tank and the observation wall.

In a method of the present invention, a surface condition of the cleaning member during a substrate cleaning operation or a cleaning-member cleaning operation is detected by surface condition detecting unit adapted to detect a surface condition of the cleaning member, and timing of replacement of the cleaning member is determined, based on a change in the surface condition detected by the surface condition detecting means. Therefore, the timing of replacement of a cleaning member can be appropriately determined, and contamination of a substrate due to wear or contamination of the cleaning member can be prevented. Therefore, a high cleaning ability of a cleaning member for cleaning a substrate can be maintained.

In the method of the present invention, the change in the surface condition of the cleaning member detected to determine the timing of replacement of the cleaning member may include a change in pore condition of a surface of the cleaning member, such as a pore size distribution or a total pore area per unit area of the surface of the cleaning member. With this arrangement, when a surface of the cleaning member changes from that of an exterior layer containing a number of pores to that of an interior layer, this change can be appropriately detected to thereby determine the timing of replacement. Thus, contamination of a substrate caused by the cleaning member can be prevented.

In the method of the present invention, the change in the surface condition of the cleaning member detected to determine the timing of replacement of the cleaning member may include a change in hardness of a surface of the cleaning member. With this arrangement, when a surface of the cleaning member changes from an exterior layer to an interior layer, this change can be appropriately detected, based on the measured hardness, to thereby determine the timing of replacement. Thus, contamination of a substrate caused by the cleaning member can be prevented.

In the method of the present invention, during scrub cleaning of the substrate in which the cleaning member is abutted against the substrate while rotating at least one of the cleaning member and the substrate, to thereby effect relative motion between the cleaning member and the substrate, a condition of rotation of the at least one of the cleaning member and the substrate is measured by rotation measurement. A surface condition of the cleaning member is detected from a change in the condition of rotation and the timing of replacement of the cleaning member is determined from a change in the detected surface condition. With this arrangement, if wear of the cleaning member is determined during scrub cleaning, the scrub cleaning can be immediately stopped for replacement of the cleaning member. Thus, the cleaning member can be replaced with appropriate timing, so that contamination of a substrate caused by the cleaning member can be prevented.

A substrate cleaning apparatus of the present invention comprises: surface condition detecting means adapted to detect a surface condition of the cleaning member during a substrate cleaning operation or a cleaning-member cleaning operation; and timing-of-replacement determining means adapted to determine timing of replacement of the cleaning member, based on a change in the surface condition of the cleaning member detected by the surface condition detecting means. With this arrangement, the timing of replacement of a cleaning member can be appropriately determined, thus making it possible to prevent contamination of a substrate due to wear or contamination of the cleaning member. Therefore, a high cleaning ability of a cleaning member for cleaning a substrate can be maintained.

The substrate cleaning apparatus of the present invention may be arranged such that: the surface condition detecting unit comprises a rotation measurement unit adapted to measure a condition of rotation of at least one of the cleaning member and the substrate. During scrub cleaning of the substrate in which the cleaning member is abutted against the substrate while rotating at least one of the cleaning member and the substrate to thereby effect relative motion between the cleaning member and the substrate, the condition of rotation of the at least one of the cleaning member and the substrate is measured. The timing-of-replacement determining unit is adapted to detect a surface condition of the cleaning member, based on a change in the measured condition of rotation. With this arrangement, if wear of the cleaning member is determined during scrub cleaning, the scrub cleaning can be immediately stopped for replacement of the cleaning member. Thus, the cleaning member can be replaced with appropriate timing, so that contamination of a substrate caused by the cleaning member can be prevented.

The substrate cleaning apparatus may be arranged such that the surface condition detecting means comprises image capturing means adapted to capture an image of a surface of the cleaning member. The timing-of-replacement determining unit is adapted to process image data captured by the image capturing device and determine the timing of replacement of the cleaning member based on a pore condition of the surface of the cleaning member, such as a pore size distribution or a total pore area per unit area of the surface of the cleaning member. With this arrangement, when the surface of the cleaning member changes from an exterior layer containing a number of pores to an interior layer, this change can be appropriately detected, to thereby determine the timing of replacement. Thus, contamination of a substrate caused by the cleaning member can be prevented.

In the substrate cleaning apparatus of the present invention, the surface condition detecting unit may comprise an observation medium provided between the cleaning member and the image capturing device, the image capturing device is adapted to capture the image of the surface of the cleaning member through the observation medium. With this arrangement, a surface condition of the cleaning member can be appropriately detected to thereby determine the timing of replacement of the cleaning member, thus preventing contamination of a substrate caused by the cleaning member.

The surface condition detecting unit may comprise a hardness measurement device adapted to measure the hardness of a surface of the cleaning member, the timing-of-replacement determining unit being adapted to determine the timing of replacement of the cleaning member based on the hardness of the surface of the cleaning member measured by the hardness measurement device. With this arrangement, when the surface of the cleaning member changes from an exterior layer to an interior layer, this change can be appropriately detected, based on the measured hardness, to thereby determine the timing of replacement. Thus, contamination of a substrate caused by the cleaning member can be prevented.

In the substrate cleaning apparatus of the present invention, the timing-of-replacement determining unit may emit a signal for replacement of the cleaning member when the surface condition detected by the surface condition detecting unit changes from the one that indicates an exterior layer to the one that indicates an interior layer. With this arrangement, the cleaning member can be replaced when the exterior layer of the cleaning member is lost, and it is therefore possible to prevent contamination of a substrate due to wear or contamination of the cleaning member. Therefore, a high cleaning ability of a cleaning member for cleaning a substrate can be maintained.

The substrate cleaning apparatus may comprise a measurement unit adapted to measure at least one of the number of particles in the cleaning liquid and a concentration of a component in the cleaning liquid in the cleaning tank, and a feedback mechanism for feeding back results of measurement by the measurement unit to the drive control device. With this arrangement, even when particles are discharged from the cleaning member due to wear, or the cleaning member is contaminated, a degree of contamination of the cleaning liquid and the cleaning member can be suppressed by appropriately controlling the operation of the abutting member.

The substrate cleaning apparatus may further comprise an overflow mechanism for overflowing the cleaning liquid contained in the cleaning tank after the cleaning member is cleaned, or a cleaning liquid supply mechanism for supplying the cleaning liquid to the cleaning member when the cleaning member is lifted from the cleaning tank. With this arrangement, there is no possibility of recontamination of the cleaning member with contaminants discharged from the cleaning member during cleaning.

In the substrate cleaning apparatus of the present invention, a signal for replacement of the cleaning member may be emitted when the at least one of the number of particles in the cleaning liquid and the concentration of the component in the cleaning liquid reaches a predetermined level. With this arrangement, replacement of the cleaning member can be conducted when particles are discharged from the cleaning member due to wear, or the cleaning member is contaminated. Therefore, contamination of a substrate caused by the cleaning member can be prevented, and a high cleaning ability of a cleaning member for cleaning a substrate can be maintained.

The substrate cleaning apparatus of the present invention may further comprise an ultrasonic cleaning mechanism for conducting ultrasonic cleaning of at least one of the cleaning member, the abutting member, the cleaning tank and the observation wall. By maintaining these members in a clean condition, a high degree of cleanliness of the cleaning member can be maintained.

DETAILED DESCRIPTION OF THE INVENTION

Hereinbelow, embodiments of the present invention are described in detail, with reference to the drawings.

First Embodiment

Figure 1:
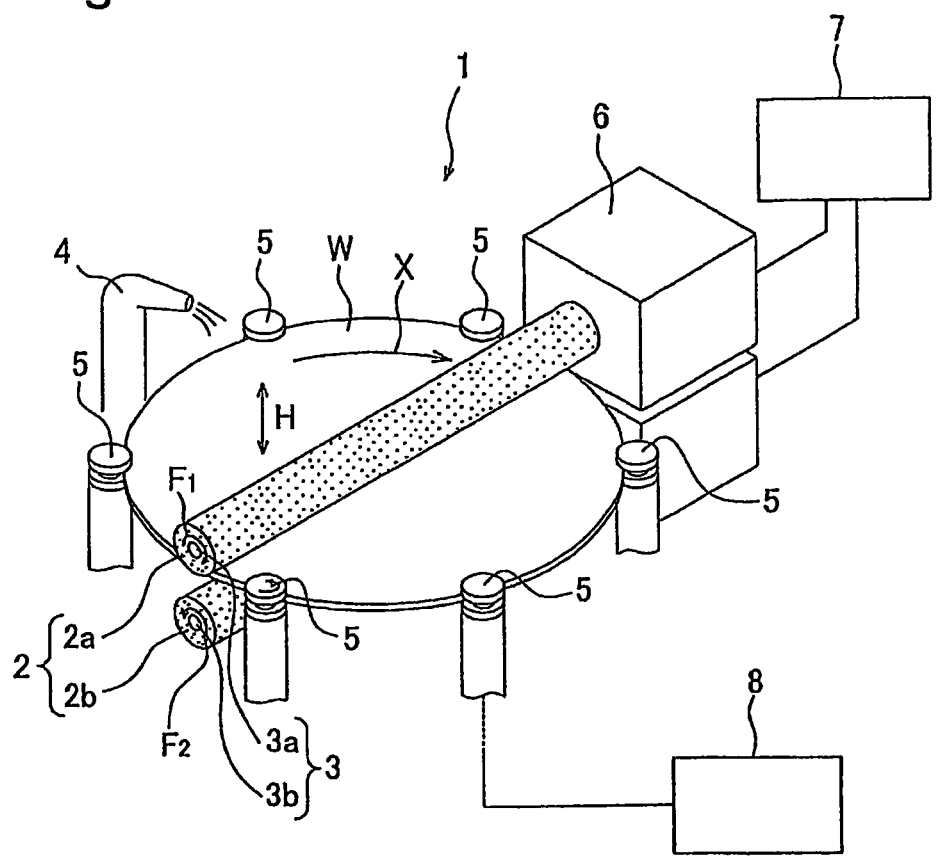
FIG. 1 shows an arrangement of a substrate cleaning apparatus according to a first embodiment of the present invention.

FIG. 1 shows an arrangement of a substrate cleaning apparatus according to a first embodiment of the present invention. In a substrate cleaning apparatus 1 shown in FIG. 1, a substrate W, such as a semiconductor substrate, is held and rotated, and opposite surfaces of the substrate W are cleaned by means of cleaning members 2. The substrate cleaning apparatus 1 comprises: a plurality of spindles 5 for supporting a peripheral edge of the substrate W and rotating the substrate W; substantially cylindrical cleaning members 2 (2a, 2b) made of a material such as foamed polyurethane, PVA, etc., each of the cleaning members 2 being attached to a shaft 3 (3a, 3b) all the way around a periphery thereof in a shape of a roll sponge; a drive device 6 for effecting vertical movement of the cleaning members 2 as indicated by an arrow H and effecting rotation of each of the cleaning members 2 about the center axis of the corresponding shaft 3 as indicated by arrows F1 and F2; a control device 7 for controlling the drive device 6 so as to control movement of the cleaning members 2; and a cleaning liquid supply nozzle 4 for feeding a cleaning liquid, such as ultra-pure water, onto an upper surface of the substrate W. The spindles 5 are connected to a drive device 8, such as a motor, and all the spindles 5 are rotated with the same number of revolutions per unit time, to thereby rotate the substrate W with a predetermined number of revolutions per unit time. An arrangement may be made such that at least one of the spindles 5 is driven to rotate the substrate W, and the other spindles 5 follow the rotation of the substrate W.

A material of the cleaning member 2 is not limited to a sponge-like material. It may have an abrasive cloth attached to a surface thereof, by way of example. Although a roll sponge having a cylindrical cleaning surface is used as the cleaning member 2 in this embodiment, the cleaning member 2 may comprise a cylindrical portion having on a surface thereof a plurality of cylindrical projections having a small diameter, which are made of the same material as used for the cylindrical portion and which extend in a coaxial relationship to the cylindrical portion. In this case, by pressing these projections against the substrate W for cleaning, cleaning of the substrate W can be conducted more effectively.

In the substrate cleaning apparatus 1 arranged as mentioned above, while the cleaning members 2 are held at upwardly and downwardly retreated positions relative to the substrate W by means of the drive device 6, the substrate W is gripped by the spindles 5 and rotated in a direction indicated by an arrow X in FIG. 1. Then, the upwardly and downwardly retreated cleaning members 2 are respectively moved downward and upward while being rotated with a predetermined number of revolutions per unit time, and abutted against an upper surface and a lower surface of the substrate W under a predetermined pressure or with a predetermined amount of pressing, thus rubbing the cleaning members 2 against opposite surfaces of the substrate W for cleaning. Further, during cleaning, a cleaning liquid (ultra-pure water and ionized water or a chemical liquid such as rare hydrofluoric acid, oxygenated water, etc.) is jetted from the cleaning liquid supply nozzle 4 onto the upper surface of the substrate W. The cleaning liquid is also jetted from a cleaning liquid supply nozzle (not shown) provided below the substrate W onto the lower surface of the substrate W.

Figure 2:
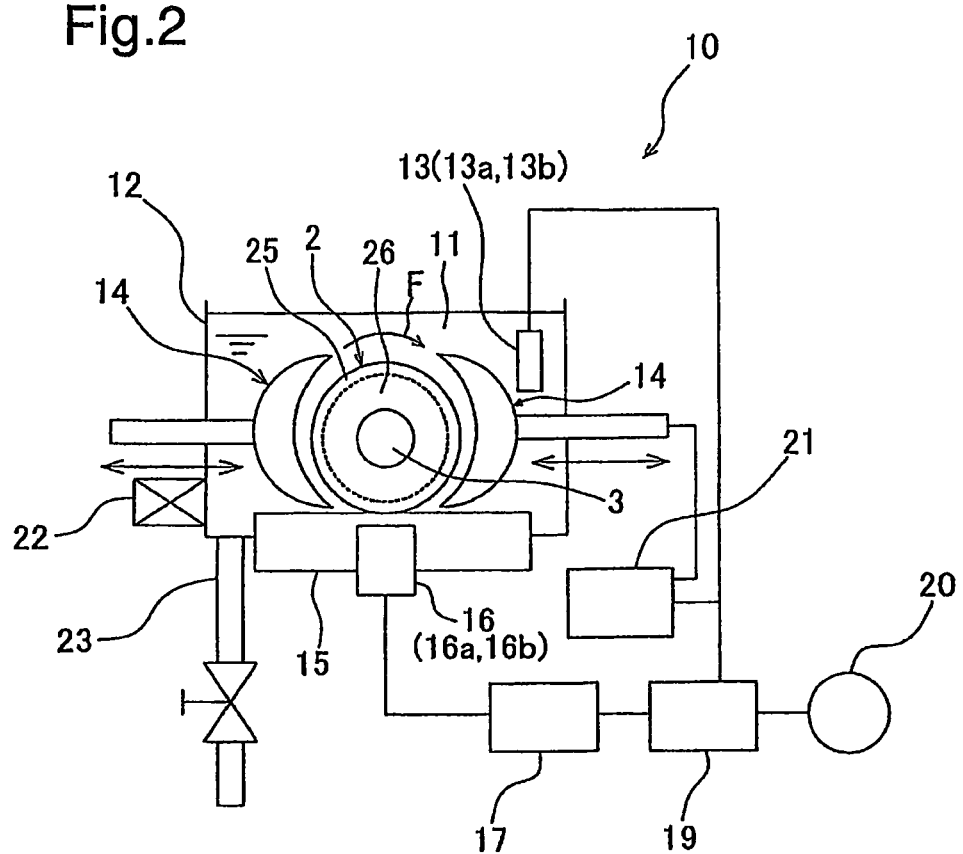
FIG. 2 shows an arrangement of a cleaning member cleaning apparatus which is provided in the substrate cleaning apparatus according to the first embodiment of the present invention.

A cleaning member cleaning apparatus is provided in the substrate cleaning apparatus 1. At a retreated position in which the cleaning member 2 is retreated (spaced apart) from a position for cleaning the substrate W, the cleaning member cleaning apparatus cleans off contaminants deposited on the cleaning member 2, such as particles of the substrate W. FIG. 2 shows an arrangement of a cleaning member cleaning apparatus. A cleaning member cleaning apparatus 10 shown in FIG. 2 comprises: a cleaning tank 12 in which a cleaning liquid 11 such as pure water is contained; and abutting members (cleaning tools) 14 which abut against the cleaning member 2, while the cleaning member 2 is impregnated with the cleaning liquid 11 and rotated in a direction indicated by an arrow F in FIG. 2 with a predetermined number of revolutions per unit time. The abutting members 14 thus effect pressure cleaning of an outer circumferential surface of the cleaning member 2. The abutting members 14 are made of a quartz plate, by way of example. The cleaning member cleaning apparatus 10 also comprises a drive device 21 for effecting translational movement of the abutting members 14. A total length of each abutting member 14 (the length in a direction perpendicular to the paper of FIG. 2) is made substantially equal to the total length of the cleaning member 2 so as to enable an entire circumferential surface of the cleaning member 2 to be cleaned. In the cleaning member cleaning apparatus 10, the cleaning member 2, before cleaning the substrate W shown in FIG. 1 or when retreated from the substrate W after cleaning, is impregnated with the cleaning liquid 11 and cleaned by means of the abutting members 14 to thereby remove contaminants, such as particles deposited on the cleaning member 2. Reference numeral 22 denotes an ultrasonic wave oscillator for oscillating ultrasonic waves towards each portion of the cleaning member cleaning apparatus 10, namely, the cleaning tank 12, the abutting members 14, the cleaning member 2, etc. Reference numeral 23 denotes a cleaning liquid supply tube for supplying the cleaning liquid 11 to the cleaning tank 12.

In the cleaning tank 12, there is provided a measurement device 13 comprising a particle counter 13$a$ for measuring the number of particles contained in the cleaning liquid 11 in the cleaning tank 12 and/or a liquid property sensor 13$b$ for measuring a property of the cleaning liquid 11 in the cleaning tank 12. A value detected by the measurement device 13 is input to a control device 19. A plate-like observation wall 15 made of a transparent or semi-transparent material, such as glass, is provided at the bottom of the cleaning tank 12. An image capturing device 16 is attached to a lower portion of the observation wall 15 so as to capture an image of a surface of the cleaning member 2 in the cleaning tank 12 through the observation wall 15. The image capturing device 16 comprises a CCD camera 16$a$ and/or a microscope 16$b$. An image captured by the image capturing device 16 is processed by an image processing device 17, to thereby form image data, which is in turn output to the control device 19. The control device 19 is connected to a display means 20.

For cleaning the cleaning member 2 in the cleaning member cleaning apparatus 10, a property of the cleaning liquid 11 in the cleaning tank 12 is monitored by the measurement means 13. In this embodiment, a degree of contamination of the cleaning liquid 11 is monitored by measuring the number of particles contained in the cleaning liquid 11 or the concentration of a component in the cleaning liquid 11. Results obtained by this monitoring are fed back to the drive device 21, to thereby control an operation of the abutting members 14 so as to lower the degree of contamination of the cleaning member 2. That is, if it is determined that the degree of contamination of the cleaning liquid 11 is high, the control device 19 determines that the cleaning member 2 is contaminated, and emits a predetermined control signal to the drive device 21. The operation of the abutting members 14 is controlled, according to the control signal, to thereby change conditions for cleaning the cleaning member 2.

Figure 3:
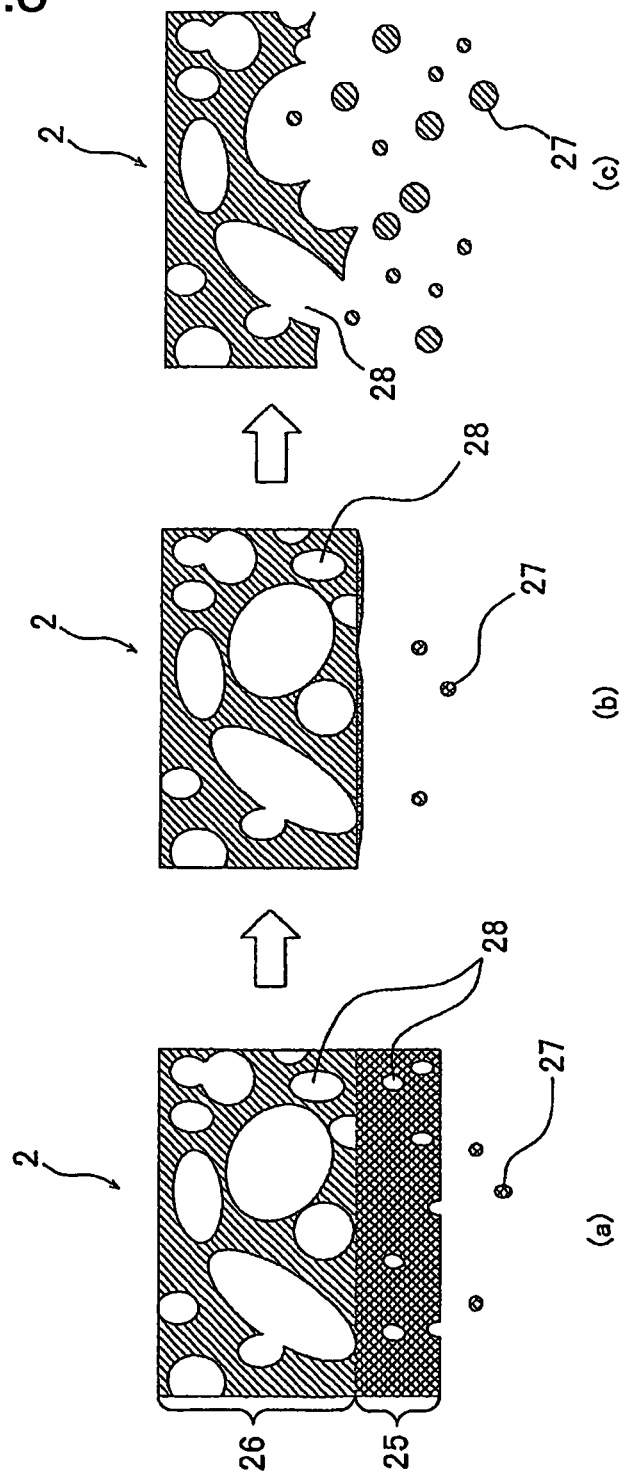
FIG. 3 is a schematic, enlarged view indicating an exterior layer and an interior layer of a cleaning member.

FIG. 3 is a schematic, enlarged view indicating an exterior layer 25 and an interior layer 26 formed below (inside) the exterior layer 25 of the cleaning member 2. As indicated in FIG. 3-($a$), the cleaning member 2 formed from a material such as a sponge comprises the exterior layer 25 formed in the vicinity of an exterior surface thereof, which is relatively hard and includes small pores 28. The interior layer 26 formed inside the exterior layer 25 is relatively soft and includes large pores 28. Therefore, when the exterior layer 25 remains in the cleaning member 2, as indicated in FIG. 3-($a$), a small number of pores 28 having a small diameter exist at the exterior surface of the cleaning member 2. However, due to rubbing the cleaning member 2 against the substrate W, the exterior layer 25 is gradually scraped and lost, as indicated in FIG. 3-($b$). When the interior layer 26 is exposed as indicated in FIG. 3-($c$), both the number and the diameter of the pores 28 at the exterior surface of the cleaning member 2 become large, so that a total pore area per unit surface area of the cleaning member 2 becomes large.

Figure 4:
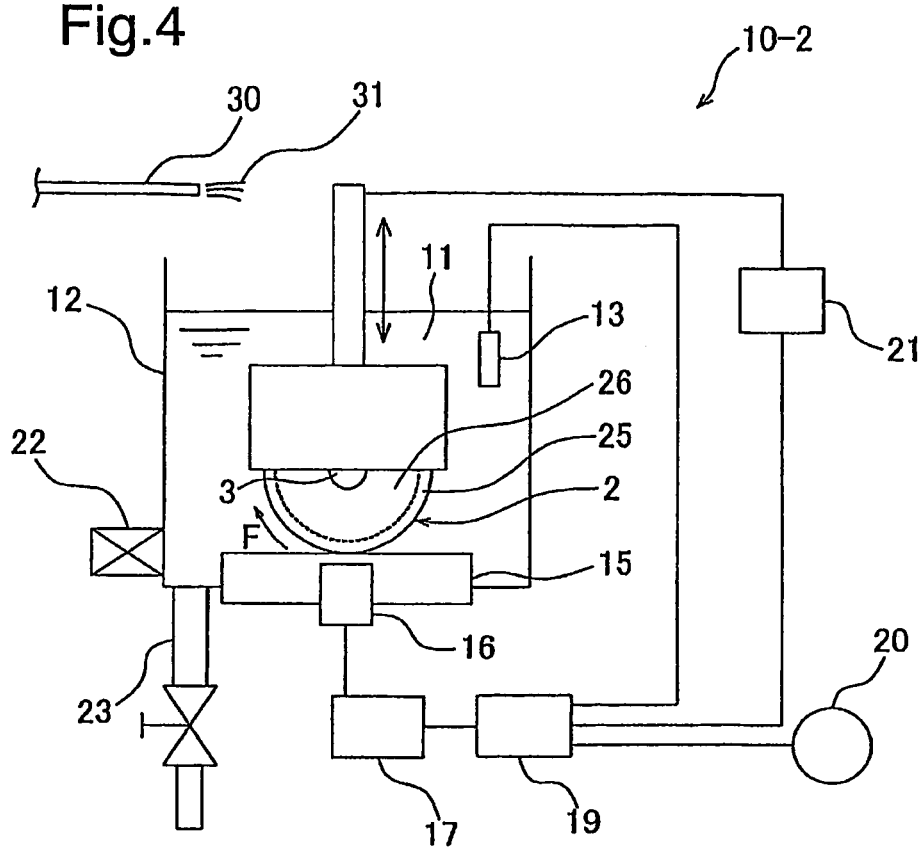
FIG. 4 shows an arrangement of a cleaning member cleaning apparatus which is provided in a substrate cleaning apparatus according to a second embodiment of the present invention.

According to experimental data on the cleaning member made of PVA, which is commonly used for cleaning a substrate, a pore diameter of the exterior layer is several μm to several tens of μm, and a pore diameter of the interior layer is 10 μm to 200 μm. Further, a total pore area per unit surface area of the exterior layer is 12 to 17%, while a total pore area per unit surface area of the interior layer is about 70%. Therefore, during cleaning, as shown in FIG. 4, the cleaning member 2 is abutted against the observation wall 15, to thereby capture an image of the exterior surface of the cleaning member 2 by the image capturing device 16. The image is processed by the image processing device 17, and data on a surface condition of the cleaning member 2 is input to the control device 19.

Thus, a pore size distribution and a total pore area per unit surface area of the cleaning member 2 are measured. Based on results obtained by this measurement, the control device 19 determines the presence/absence of the exterior layer 25 in the cleaning member 2. That is, if it is detected from the data obtained by processing the image from the image capturing device 16 that the number of pores and the total pore area per unit surface area of the cleaning member 2 are small, the control device 19 determines that the exterior layer 25 remains in the cleaning member 2. If it is detected from the data obtained by processing the image from the image capturing device 16 that the number of pores and the total pore area per unit surface area of the cleaning member 2 are large, the control device 19 determines that the exterior layer 25 is lost.

When the control device 19 determines that the exterior layer 25 is lost, it outputs a signal for replacement of the cleaning member 2 to the display device 20, and the display device 20 indicates that the cleaning member 2 should be replaced. If the control device 19 determines that the exterior layer 25 remains, but it is determined, by the measurement device 13, that the cleaning liquid 11 in the cleaning tank 12 is highly contaminated, the control device 19 determines that the cleaning member 2 is contaminated and outputs the signal for replacement to the display device 20, or sends a predetermined signal to the drive device 21 to thereby change the conditions for cleaning the cleaning member 2. If the cleaning member 2 comprises the above-mentioned cylindrical projections having a small diameter, a surface condition of the projections of the cleaning member 2 is detected, to thereby determine the timing of replacement.

In the cleaning member cleaning apparatus 10, when the cleaning tank 12, the abutting members 14, the observation wall 15, etc. are contaminated, ultrasonic waves can be oscillated by the ultrasonic wave oscillator 22, to thereby conduct ultrasonic cleaning of at least one of the cleaning tank 12, the cleaning member 2, the abutting members 14, the observation wall 15, etc. Further, after completion of the operation for cleaning the cleaning member 2, the cleaning liquid 11 in the cleaning tank 12 is overflowed, to thereby fill the cleaning tank 12 with a cleaning liquid 11 in a clean condition supplied from the cleaning liquid supply tube 23. Therefore, there is no possibility of the cleaning member 2 being recontaminated with contaminants discharged from the cleaning member 2 during cleaning.

In the above embodiment, an image of a surface of the cleaning member 2 abutted against the observation wall 15 is captured through the observation wall 15. However, in the present invention, the observation wall 15 may be omitted and a surface image of the cleaning member 2 may be captured by the image capturing device 16 through the cleaning liquid 11 in the cleaning tank 12. The image capturing device 16 may be provided outside the cleaning tank 12. In this case, a surface image of the cleaning member 2 can be captured by the image capturing device 16 when the cleaning member 2 is lifted from the cleaning liquid 11 into the air. That is, a surface image of the cleaning member 2 can be captured by the image capturing device 16 through an observation medium of a solid, a liquid or a gas interposed between the image capturing device 16 and the cleaning member 2.

Second Embodiment

FIG. 4 shows an arrangement of a cleaning member cleaning apparatus 10-2 provided in a substrate cleaning apparatus according to a second embodiment of the present invention. An arrangement of the substrate cleaning apparatus in the second embodiment is the same as that of the substrate cleaning apparatus 1 shown in FIG. 1, and therefore explanation thereof is omitted. Further, the portions of the cleaning member cleaning apparatus 10-2 which are the same as those of the cleaning member cleaning apparatus 10 shown in FIG. 2 are designated by the same reference numerals as used in FIG. 2, and an explanation thereof is omitted. The same applies to the other embodiments. In the cleaning member cleaning apparatus 10-2, the drive device 21 effects vertical movement of the cleaning member 2, instead of effecting translational movement of the abutting members 14 as in the cleaning member cleaning apparatus 10. With this arrangement, the cleaning member 2 is repeatedly collided against the observation wall 15 provided at the bottom of the cleaning tank 12 for cleaning. During cleaning, a surface condition of the cleaning member 2 abutted against the observation wall 15 is monitored through the observation wall 15 by the image capturing device 16. The control device 19 determines the presence/absence of the exterior layer 25, based on a pore size distribution and a total pore area per unit area of the surface of the cleaning member 2. When the control device 19 determines that the exterior layer 25 is lost, it outputs a signal indicative of the absence of the exterior layer 25 to the display device 20.

At the same time, the number of particles contained in the cleaning liquid 11 and/or the concentration of a component in the cleaning liquid 11 in the cleaning tank 12 is monitored by the measurement device 13, and results of this monitoring are fed back to the drive device 21, to thereby control a movement of the cleaning member 2 so as to lower the degree of contamination of the cleaning member 2. After completion of the operation for cleaning the cleaning member 2, the cleaning member 2 is lifted from the cleaning tank 12 into the air (into a gas), and a cleaning liquid 31 is jetted from a cleaning liquid supply tube 30 onto the cleaning member 2. Consequently, even when contaminants discharged from the cleaning member 2 are contained in the cleaning liquid 11 in the cleaning tank 12 and deposited on the cleaning member 2, such contaminants can be cleaned off by the cleaning liquid 31, so that there is no risk of recontamination of the cleaning member 2 with contaminants discharged from the cleaning member 2.

Third Embodiment

Figure 5:
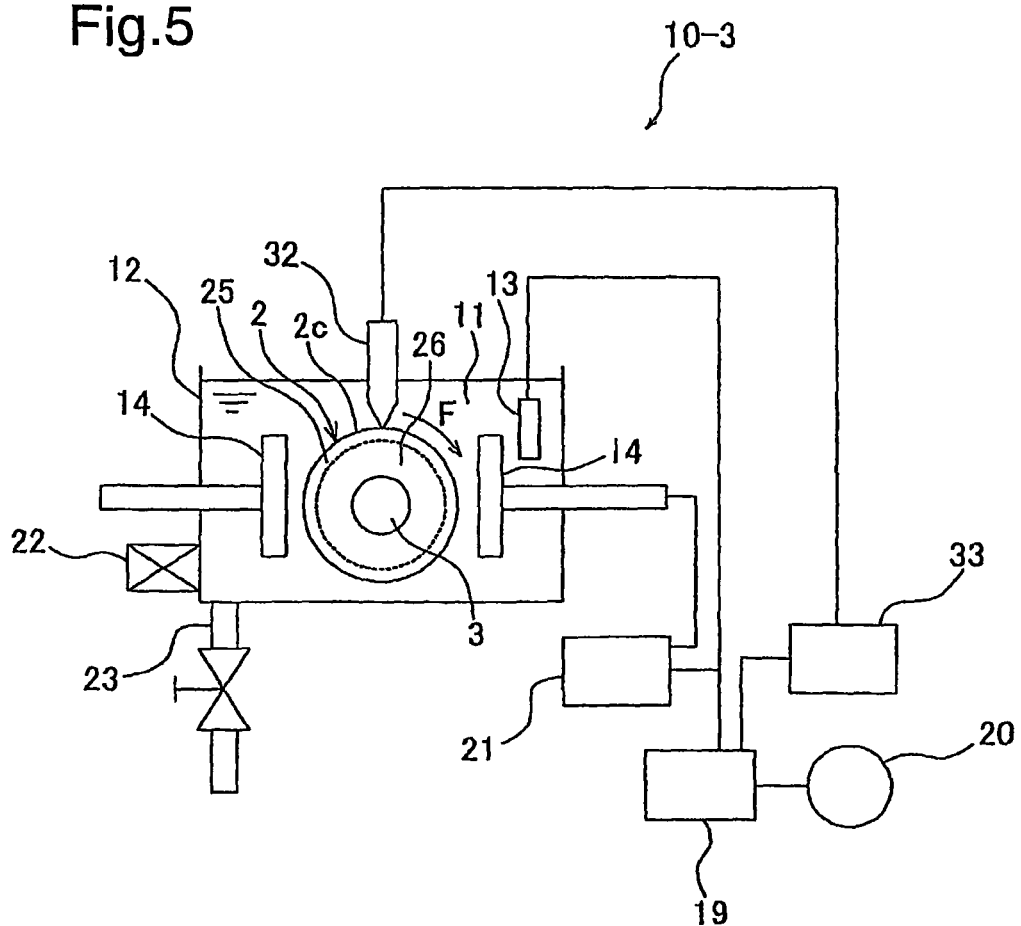
FIG. 5 shows an arrangement of a cleaning member cleaning apparatus which is provided in a substrate cleaning apparatus according to a third embodiment of the present invention.

FIG. 5 shows a cleaning member cleaning apparatus 10-3 provided in a substrate cleaning apparatus according to a third embodiment of the present invention. The cleaning member cleaning apparatus 10-3 comprises a hardness measurement device 32 for measuring the hardness of a surface of the cleaning member 2, and a hardness data processing device 33. As the hardness measurement device 32, use is made of an ultra-micro hardness meter or a thin-film hardness meter, by way of example.

As shown in FIG. 5, while a property of the cleaning liquid 11 in the cleaning tank 12 is monitored by the measurement device 13, the cleaning member 2 is rotated in the cleaning tank 12 and subjected to pressure cleaning using the abutting members 14, which perform translational movement. During cleaning, the hardness measurement device 32 is brought into contact with a surface 2c of the cleaning member 2, to thereby conduct measurement of hardness. Hardness data thus obtained is output to the control device 19 through the hardness data processing device 33. The control device 19 determines the presence/absence of the exterior layer 25, based on the measured hardness of the cleaning surface 2c.

If the control device 19 determines that the exterior layer 25 is lost, the control device 19 outputs a signal indicative of the absence of the exterior layer 25 to the display device 20. Since the exterior layer 25 is relatively hard, as indicated in FIG. 3-(a), during the initial stage of cleaning, only a slight amount of scraps 27 are generated in the exterior layer 25 of the cleaning member 2 by rubbing the cleaning member 2 against the substrate W. As the amount of wear of the cleaning member 2 increases, the interior layer 26, which contains a number of pores 28 and is soft, is exposed and the amount of scraps 27 increases as indicated in FIG. 3-(c). Therefore, the hardness measurement device 32 detects when the interior layer 26 begins to be exposed, preferably with the exterior layer 25 slightly remaining as shown in FIG. 3-(b), and the control device 19 outputs a signal for replacement of the cleaning member 2 at this time of detection. Thus, by determining the timing of replacement based on an amount of wear of the cleaning member 2, contamination of the substrate W caused by the scraps 27 discharged from the cleaning member 2 can be prevented.

On the other hand, if the control device 19 determines that the exterior layer 25 remains in the cleaning member 2, but it is determined, by the measurement means 13, that the cleaning liquid 11 in the cleaning tank 12 is highly contaminated, the control device 19 determines that the cleaning member 2 is contaminated. Consequently, the signal for replacement is output to the display device 20, or a predetermined signal is sent to the drive device 21 to thereby change the conditions for cleaning the cleaning member 2 with the abutting members 14. With this arrangement, if the scraps 27 are discharged due to wear of the cleaning member 2, or if the cleaning member 2 is contaminated, an operation of the abutting members 14 can be appropriately controlled, to thereby lower the degree of contamination of the cleaning liquid 11 and the cleaning member 2.

Fourth Embodiment

Figure 6:
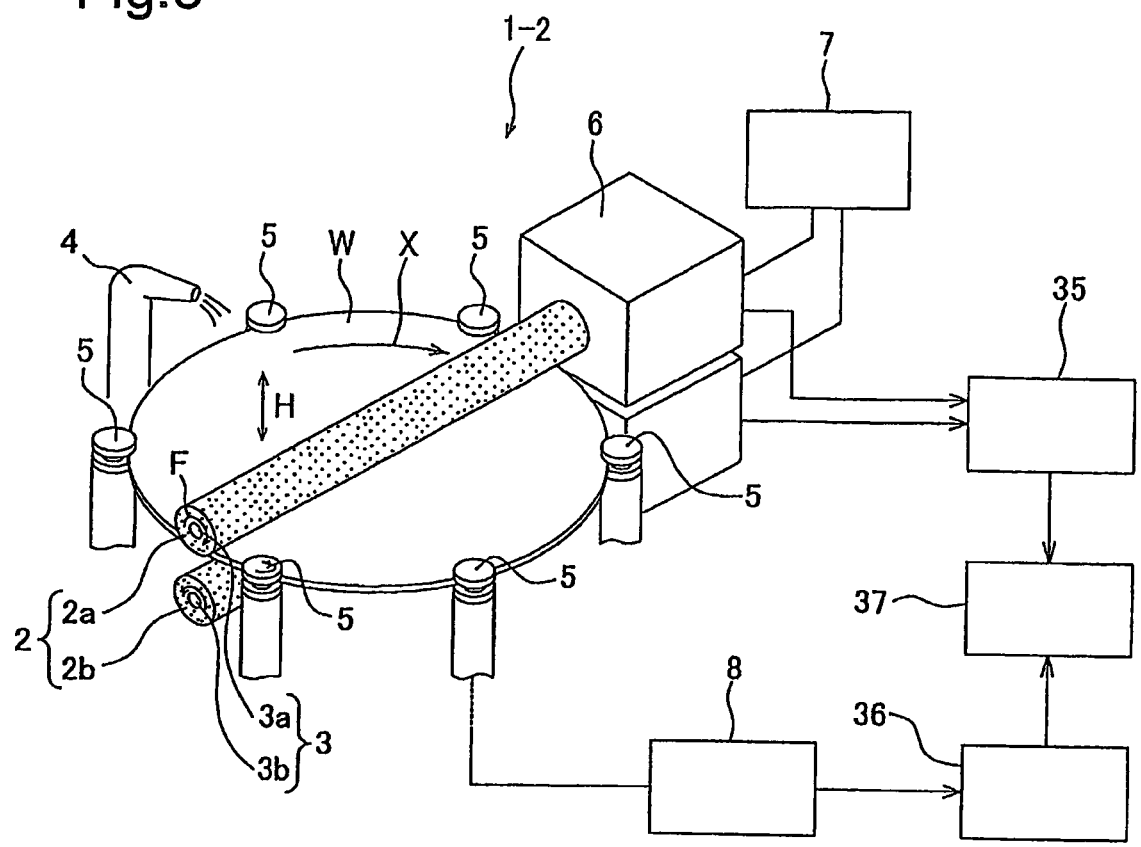
FIG. 6 shows an arrangement of a substrate cleaning apparatus according to a fourth embodiment of the present invention.

FIG. 6 shows an arrangement of a substrate cleaning apparatus 1-2 according to a fourth embodiment of the present invention. The substrate cleaning apparatus 1-2 comprises a rotation measurement mechanism 35 as a surface condition detecting device for detecting a surface condition of the cleaning member 2. The rotation measurement mechanism 35 is adapted to measure a change in the number of revolutions of the cleaning member 2 per unit time or a change in pressure of the cleaning member 2 applied to the substrate W during a substrate cleaning operation, as a change in output value (current value) or torque of a motor or the like provided in the drive device 6 for rotatably driving the cleaning member 2. The substrate cleaning apparatus 1-2 also comprises, as a surface condition detecting device, a rotation measurement mechanism 36 for measuring a change in the number of revolutions of the spindle 5 per unit time as a change in output value (current value) or torque of a motor or the like for rotatably driving the spindle 5. The substrate cleaning apparatus 1-2 further comprises, as a timing-of-replacement determining means for determining the timing of replacement of the cleaning member 2, a data processing device 37 for processing measurement values that are output from the rotation measurement mechanisms 35 and 36.

A change in property of a surface of the cleaning member 2, such as a change in pore condition (i.e., a pore size distribution, a pore area, etc.) or surface hardness, is recognized as a change in frictional force between the surface of the cleaning member 2 and the substrate W during cleaning, in which the cleaning member 2 is abutted against the substrate W. If the cleaning member 2 or the substrate W is rotated with a predetermined motor torque or output (constant-torque/output control), the change in frictional force is detected as a change in the number of revolutions of the cleaning member 2 or the substrate W (or the spindle 5) per unit time when the cleaning member 2 is abutted against the substrate W under a predetermined pressure or with a predetermined amount of pressing. If the cleaning member 2 or the substrate W (the spindle 5) is rotated with a predetermined number of revolutions per unit time (for example, 100 rpm) that is pre-set by the control device 7 or a setting means (not shown) (constant-number-of-revolutions control), the change in frictional force is detected as a change in motor output value (current value) or torque of the drive device 6 or the drive device 8. Therefore, by providing either one or both of the rotation measurement mechanism 35, which measures an output value of the drive device 6 for rotatably driving the cleaning member 2 or the number of revolutions of the cleaning member 2 per unit time, and the rotation measurement mechanism 36, which measures an output value of the drive device 8 for rotatably driving the substrate W (or the spindle 5) or the number of revolutions of the substrate W (or the spindle 5) per unit time, an amount of wear of the cleaning member 2 can be determined, using a measurement value from the rotation measurement mechanism 35 or 36.

In the substrate cleaning apparatus 1-2, to effect the above-mentioned constant-number-of-revolutions control, the substrate W is rotated with a predetermined number of revolutions per unit time while being held by the spindles 5. The cleaning members 2 above and below the substrate W are moved, while being rotated with a predetermined number of revolutions per unit time, downward and upward and abutted against an upper surface and a lower surface of the substrate W, under a predetermined pressure or with a predetermined amount of pressing. Thus, the cleaning members 2 are rubbed against opposite surfaces of the substrate W, to thereby clean the opposite surfaces of the substrate W. During cleaning, motor voltages of the drive device 6 for driving the cleaning member 2 and the drive device 8 for driving the spindle 5 are controlled to predetermined values so as to obtain a predetermined number of revolutions per unit time for the cleaning member 2 and for the substrate W. In this state, measurement is conducted with respect to current values, power consumption, torques, etc. of the motors by the rotation measurement mechanisms 35 and 36. Values measured by the rotation measurement mechanisms 35 and 36 are processed by the data processing device 37, to thereby observe a change in the measurement values and determine the amount of wear of the cleaning member 2 or a change of the cleaning member 2 with time, thus determining the timing of the replacement of the cleaning member 2. Further, a failure, such as missing of the cleaning member 2, can be detected. Thus, by measuring currents, power consumption, torques, etc. of the motors during cleaning of the substrate W, the timing of replacement of the cleaning member 2 can be determined before the measurement values exceed reference values which indicate that an amount of wear of the cleaning member 2 becomes equal to or greater than a predetermined value or reference values which indicate that a failure such as missing of the cleaning member 2 occurs.

To clean the cleaning member 2 in the substrate cleaning apparatus 1-2, a motor voltage of the drive device 6 for driving the cleaning member 2 is controlled to a predetermined value so as to obtain a predetermined number of revolutions per unit time of the cleaning member 2. In this condition, the cleaning member 2 is retreated from a cleaning position for cleaning the substrate W, and impregnated with the cleaning liquid 11 in the cleaning tank 12 such as that shown in FIG. 2 or 4. The cleaning member 2 is cleaned in the cleaning tank 12 by abutting the abutting members 14 against the cleaning member 2 under a predetermined pressure or with a predetermined amount of pressing. Otherwise, the cleaning member 2 is reciprocally moved in a vertical direction and repeatedly collided against the observation wall 15 provided at the bottom of the cleaning tank 12. During cleaning of the cleaning member 2, a change in motor current, power consumption, torque, etc. of the drive device 6 is measured by the rotation measurement mechanism 35. Based on a measurement value from the rotation measurement mechanism 35, a change in frictional force between the cleaning member 2 and the abutting members 14, or between the cleaning member 2 and the observation wall 15 is measured, to thereby determine an amount of wear of the cleaning member 2, thus determining the timing of the replacement of the cleaning member 2.

Fifth Embodiment

Figure 7:
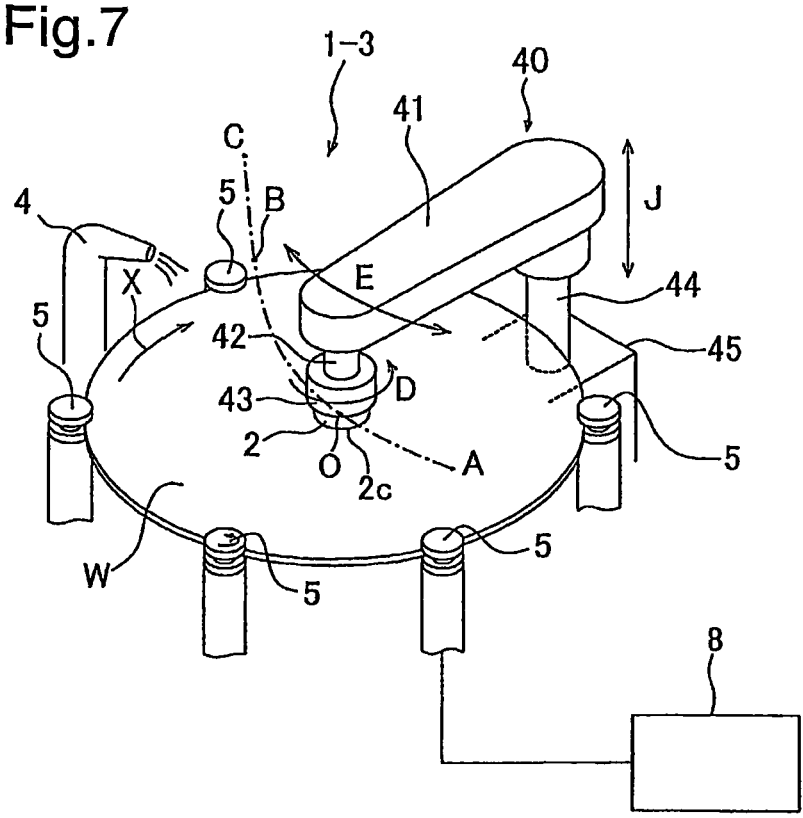
FIG. 7 shows an arrangement of a substrate cleaning apparatus according to a fifth embodiment of the present invention.

FIG. 7 shows an arrangement of a substrate cleaning apparatus 1-3 according to a fifth embodiment of the present invention. In the substrate cleaning apparatus 1-3, a pencil type sponge is used as the cleaning member 2, instead of a roll sponge used as the cleaning member 2 in the substrate cleaning apparatus 1 shown in FIG. 1 or the substrate cleaning apparatus 1-2 shown in FIG. 6. This cleaning member (hereinafter referred to as a "pencil type sponge") 2 is made of foamed polyurethane, PVA, etc., which is formed into a cylindrical or trapezoidal configuration. The cleaning surface 2c formed in a lower surface of the cleaning member 2 is adapted to abut against the substrate W while being rotated in a horizontal plane about an axis (a rotary shaft 42) orthogonal to the cleaning surface 2c. The other portions of the substrate cleaning apparatus 1-3 are the same as those of the substrate cleaning apparatus 1 or the substrate cleaning apparatus 1-2, and an explanation thereof is therefore omitted.

The pencil type sponge 2 is held by a cleaning member holding mechanism 40. The cleaning member holding mechanism 40 comprises a horizontally extending pivot arm 41, with the rotary shaft 42 being attached to a forward end of the pivot arm 41 so as to extend in a vertically downward direction. The pencil type sponge 2 is attached to a forward end of the rotary shaft 42, while being held by a holding tool 43. The rotary shaft 42 is rotated in a direction indicated by an arrow D by means of a rotation mechanism (not shown), to thereby rotate the pencil type sponge 2 in the direction indicated by the arrow D. Further, a pivot shaft 44 and a drive device 45 are attached to a rear end portion of the pivot arm 41. The pivot arm 41 is adapted to be pivotally moved in a direction indicated by an arrow E, and moved in a vertical direction indicated by an arrow J, by the pivot shaft 44 and the drive device 45.

In the substrate cleaning apparatus 1-3, with the substrate W being rotated in a direction indicated by the arrow X in FIG. 7 while being supported by the spindles 5, a cleaning liquid such as pure water is supplied from the cleaning liquid supply nozzle 4 onto an upper surface of the substrate W. In this state, the pencil type sponge 2 is moved downward while being rotated with a predetermined number of revolutions per unit time, and the cleaning surface 2c is abutted against the upper surface of the substrate W at a position A (a cleaning start position) under a predetermined pressure or with a predetermined amount of pressing. Then, the pivot arm 41 is pivotally moved in a direction indicated by the arrow E so that the cleaning member 2 passes a position O as the center of rotation of the substrate W, thus rubbing the pencil type sponge 2 against the upper surface of the substrate W for scrub cleaning. After completion of the scrub cleaning, the pivot arm 41 is moved upward and pivotally moved, to thereby move the pencil type sponge 2 through a position B, as a peripheral position for cleaning, to a position C as a retreated position.

Figure 8:
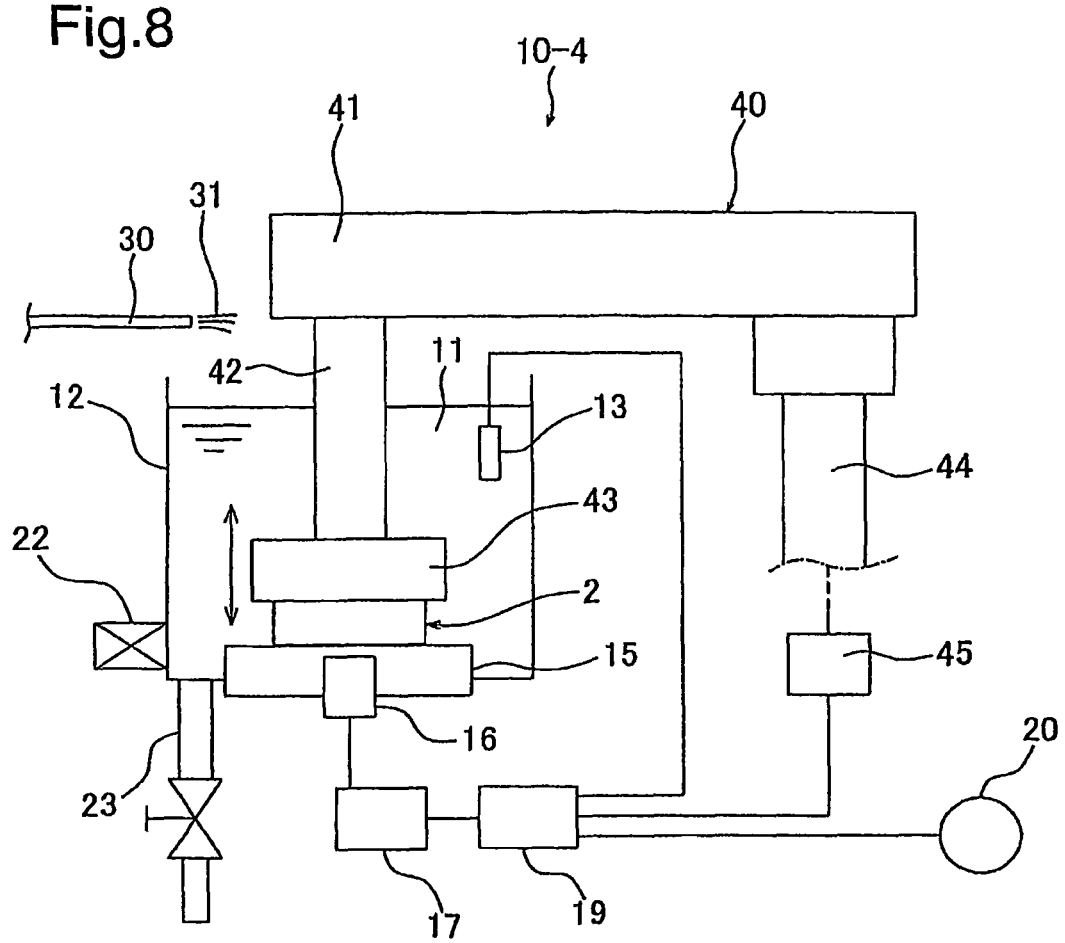
FIG. 8 shows an arrangement of a cleaning member cleaning apparatus which is provided in the substrate cleaning apparatus according to the fifth embodiment of the present invention.

FIG. 8 shows an arrangement of a cleaning member cleaning apparatus for cleaning the pencil type sponge 2 at the retreated position C in the substrate cleaning apparatus 1-3 of FIG. 7. In a cleaning member cleaning apparatus 10-4 shown in FIG. 8, the pencil type sponge 2 is impregnated with the cleaning liquid 11 in the cleaning tank 12 and repeatedly collided against the observation wall 15 for cleaning. An arrangement and an operation of the cleaning member cleaning apparatus 10-4 are the same as those of the cleaning member cleaning apparatus 10-2 shown in FIG. 4, and therefore a detailed explanation thereof is omitted.

Figure 9:
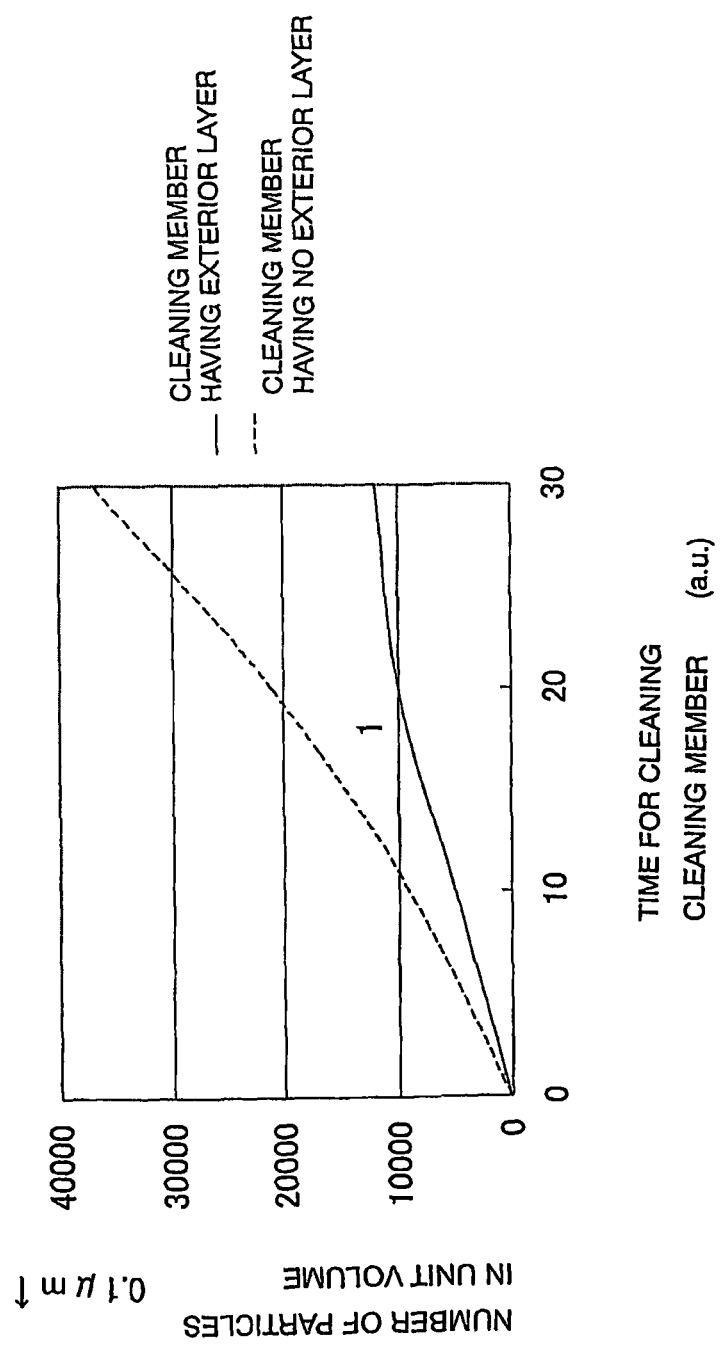
FIG. 9 is a graph indicating a change with time in the number of particles contained in a cleaning liquid when a cleaning member is cleaned in a cleaning tank.

FIG. 9 is a graph indicating a change with time in the number of particles contained in a cleaning liquid when a cleaning member is cleaned in a cleaning tank. In FIG. 9, the ordinate indicates the number of particles having a diameter of 0.1 μm or more in a unit volume of the cleaning liquid, and the abscissa indicates the time (a. u.) for cleaning the cleaning member. "a. u." is an abbreviation of arbitrary unit. A solid line indicates a case in which an exterior layer exists in the cleaning member, and a chain line indicates a case in which no exterior layer exists in the cleaning member. Although the number of particles varies, depending on the method and time for cleaning the cleaning member, the number of particles with no exterior layer existing in the cleaning member is two to three times that with an exterior layer existing in the cleaning member, as seen from a right-side portion of the graph in FIG. 9.

Figure 10:
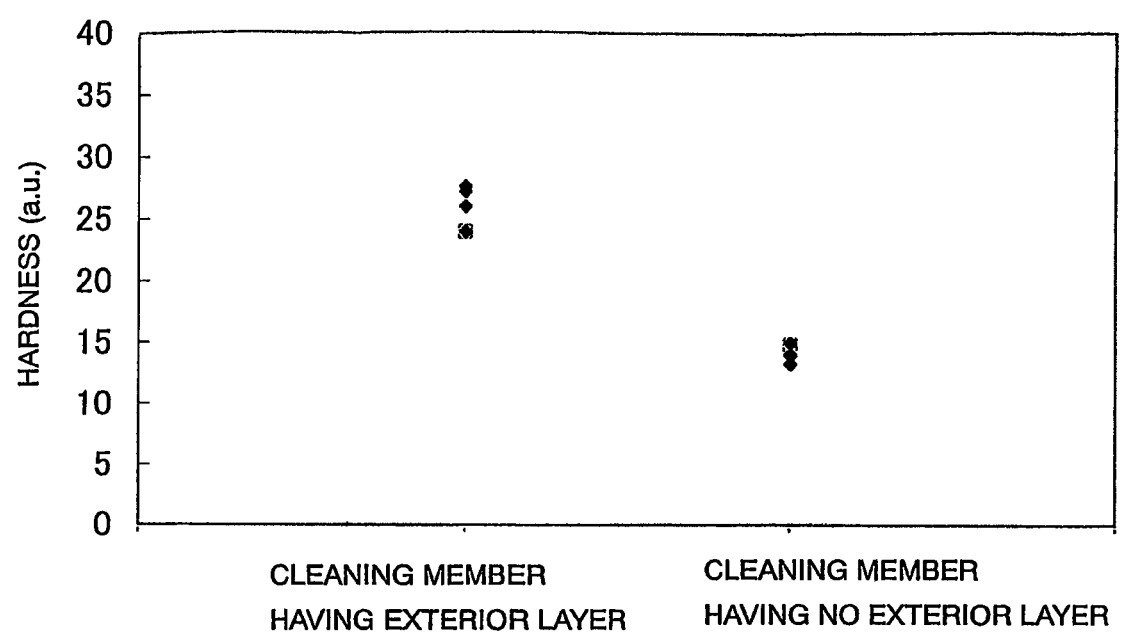
FIG. 10 shows results of measurement of a hardness value of each of a cleaning member having an exterior layer and a cleaning member having no exterior layer when scrub cleaning of a substrate is conducted by effecting relative motion between the cleaning member and the substrate.

FIG. 10 shows results of measurement of a hardness value of each of a cleaning member having an exterior layer and a cleaning member having no exterior layer when scrub cleaning of a substrate is conducted by effecting relative motion between the substrate and the cleaning member. As indicated in FIG. 10, although the hardness value (arbitrary unit) of the cleaning member varies, depending on the magnitude of an applied load, the hardness value of the cleaning member having an exterior layer is 25 to 30, while the hardness value of the cleaning member having no exterior layer is 13 to 15. That is, the hardness of the cleaning member is decreased by about half when the exterior layer has been lost.

Embodiments of the present invention have been described above. However, the present invention is not limited to the above-described embodiments, and various modifications are possible within the scope of the technical idea disclosed in the claims, specification and drawings. Any forms and materials which are not directly indicated in the specification or drawings are also within the scope of the technical idea of the present invention, as long as working effects of the present invention can be obtained. For example, the arrangement of each of the substrate cleaning apparatuses 1, 1-2 and 1-3 and each of the cleaning member cleaning apparatuses 10, 10-2, 10-3 and 10-4 shown in the above embodiments can be appropriately combined with each other.

The abutting member 14 is not limited to a quartz plate. The abutting member 14 may have a brush or particles of diamond pellets attached on a surface thereof, or may comprise an abrasive cloth. The form of the abutting member 14 is not particularly limited. An abutting surface of the abutting member 14 may be flat, or may be curved to conform to an outer circumferential surface of the cleaning member 2.

The invention claimed is:

1. A method of determining timing of replacement of a cleaning member in a substrate cleaning apparatus, the cleaning member being abutted against a substrate to effect scrub cleaning of the substrate, the cleaning member including an exterior layer and an interior layer having different hardness conditions and pore conditions, said method comprising:

detecting a pore condition of a surface of the cleaning member using an image capturing device during a substrate cleaning operation or a cleaning member cleaning operation;

measuring a hardness of the surface of the cleaning member using a hardness measurement device during the substrate cleaning operation or the cleaning member cleaning operation; and determining when to replace the cleaning member based on a change in the detected pore condition of the surface of the cleaning member or a change in the measured hardness of the surface of the cleaning member during the substrate cleaning operation or the cleaning member cleaning operation, said determining when to replace the cleaning member includes determining an absence of the exterior layer based on (a) the change in the detected pore condition of the surface of the cleaning member, or (b) the change in the measured hardness of the surface of the cleaning member.

2. The method according to claim 1, wherein said detecting the pore condition comprises detecting a pore size distribution or a total pore area per unit area of the surface of the cleaning member.

3. The method according to claim 1, wherein said detecting the pore condition comprises detecting a pore size distribution or a total pore area per unit area of the surface of the cleaning member.

4. The method according to claim 1, wherein said detecting the pore condition of the surface of the cleaning member comprises using the image capturing device to capture an image of the surface of the cleaning member through a transparent observation wall, the cleaning member abutting against the observation wall.

5. The method according to claim 1, wherein said detecting the pore condition of the surface of the cleaning member comprises using the image capturing device to capture an image of the surface of the cleaning member through cleaning liquid within a cleaning tank in which the cleaning member is submerged.

6. A method of determining timing of replacement of a cleaning member in a substrate cleaning apparatus, the cleaning member being abutted against a substrate to effect scrub cleaning of the substrate, the cleaning member including an exterior layer and an interior layer having different pore conditions, said method comprising:

detecting a pore condition of a surface of the cleaning member using an image capturing device during a substrate cleaning operation or a cleaning member cleaning operation; and determining when to replace the cleaning member based on a change in the detected pore condition of the surface of the cleaning member during the substrate cleaning operation or the cleaning member cleaning operation.

7. The method according to claim 6, wherein said determining when to replace the cleaning member includes determining an absence of the exterior layer based on the change in the detected pore condition of the surface of the cleaning member.

8. The method according to claim 7, wherein said detecting the pore condition comprises detecting a pore size distribution or a total pore area per unit area of the surface of the cleaning member.

9. The method according to claim 6, wherein said detecting the pore condition comprises detecting a pore size distribution or a total pore area per unit area of the surface of the cleaning member.

10. The method according to claim 6, wherein said detecting the pore condition of the surface of the cleaning member comprises using the image capturing device to capture an image of the surface of the cleaning member through a transparent observation wall, the cleaning member abutting against the observation wall.

11. The method according to claim 6, wherein said detecting the pore condition of the surface of the cleaning member comprises using the image capturing device to capture an image of the surface of the cleaning member through cleaning liquid within a cleaning tank in which the cleaning member is submerged.

12. A method of determining timing of replacement of a cleaning member in a substrate cleaning apparatus, the cleaning member being abutted against a substrate to effect scrub cleaning of the substrate, the cleaning member including an exterior layer and an interior layer having different hardness conditions, said method comprising:

measuring a hardness of a surface of the cleaning member using a hardness measurement device during a substrate cleaning operation or a cleaning member cleaning operation; and determining when to replace the cleaning member based on a change in the measured hardness of the surface of the cleaning member during the substrate cleaning operation or the cleaning member cleaning operation.

13. The method according to claim 12, wherein said determining when to replace the cleaning member includes determining an absence of the exterior layer based on the change in the measured hardness of the surface of the cleaning member.

* * * * *